(12) United States Patent
Kawatsu et al.

(10) Patent No.: US 10,672,586 B2
(45) Date of Patent: Jun. 2, 2020

(54) ION IMPLANTATION APPARATUS AND ION IMPLANTATION METHOD

(71) Applicant: SUMITOMO HEAVY INDUSTRIES ION TECHNOLOGY CO., LTD., Tokyo (JP)

(72) Inventors: Sho Kawatsu, Ehime (JP); Noriyasu Ido, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 16/270,960

(22) Filed: Feb. 8, 2019

(65) Prior Publication Data

US 2019/0244782 A1 Aug. 8, 2019

(30) Foreign Application Priority Data

Feb. 8, 2018 (JP) ................... 2018-020945

(51) Int. Cl.
*H01J 37/147* (2006.01)
*H01J 37/317* (2006.01)
*H01J 37/20* (2006.01)

(52) U.S. Cl.
CPC .......... *H01J 37/1474* (2013.01); *H01J 37/20* (2013.01); *H01J 37/3171* (2013.01); *H01J 2237/20207* (2013.01); *H01J 2237/24535* (2013.01); *H01J 2237/24578* (2013.01)

(58) Field of Classification Search
CPC .... H01J 37/1474; H01J 37/20; H01J 37/3171; H01J 2237/20207; H01J 2237/24535; H01J 2237/24578

USPC ......... 250/396 R, 397, 492.1, 492.2, 492.21, 250/492.22, 492.23, 492.3
See application file for complete search history.

(56) References Cited

U.S. PATENT DOCUMENTS

| 9,449,791 | B2 | 9/2016 | Tsukihara et al. | |
| 2004/0262533 | A1* | 12/2004 | Krueger | H01J 37/244 250/397 |
| 2008/0230697 | A1* | 9/2008 | Tanimoto | G01N 23/225 250/310 |
| 2009/0314959 | A1* | 12/2009 | Gammel | H01J 37/244 250/492.3 |

(Continued)

FOREIGN PATENT DOCUMENTS

JP 2016-004614 A 1/2016

*Primary Examiner* — Nicole M Ippolito
(74) *Attorney, Agent, or Firm* — Michael Best & Friedrich LLP

(57) ABSTRACT

A beamline device includes a deflection device deflecting an ion beam in a first direction perpendicular to a beam traveling direction by applying at least one of an electric field and a magnetic field to the ion beam. A slit is disposed such that the first direction coincides with a slit width direction. A beam current measurement device is configured to be capable of measuring a beam current at a plurality of measurement positions to be different positions in the first direction. A control device calculates angle information in the first direction on the ion beam by acquiring a plurality of beam current values measured at the plurality of measurement positions to be the different positions in the first direction by the beam current measurement device while changing a deflection amount of the ion beam in the first direction with the deflection device.

22 Claims, 11 Drawing Sheets

(56) References Cited

U.S. PATENT DOCUMENTS

| | | | |
|---|---|---|---|
| 2013/0001433 A1* | 1/2013 | Lin | H01J 37/244 250/398 |
| 2015/0034835 A1* | 2/2015 | Matsunaga | H01J 37/28 250/397 |

* cited by examiner

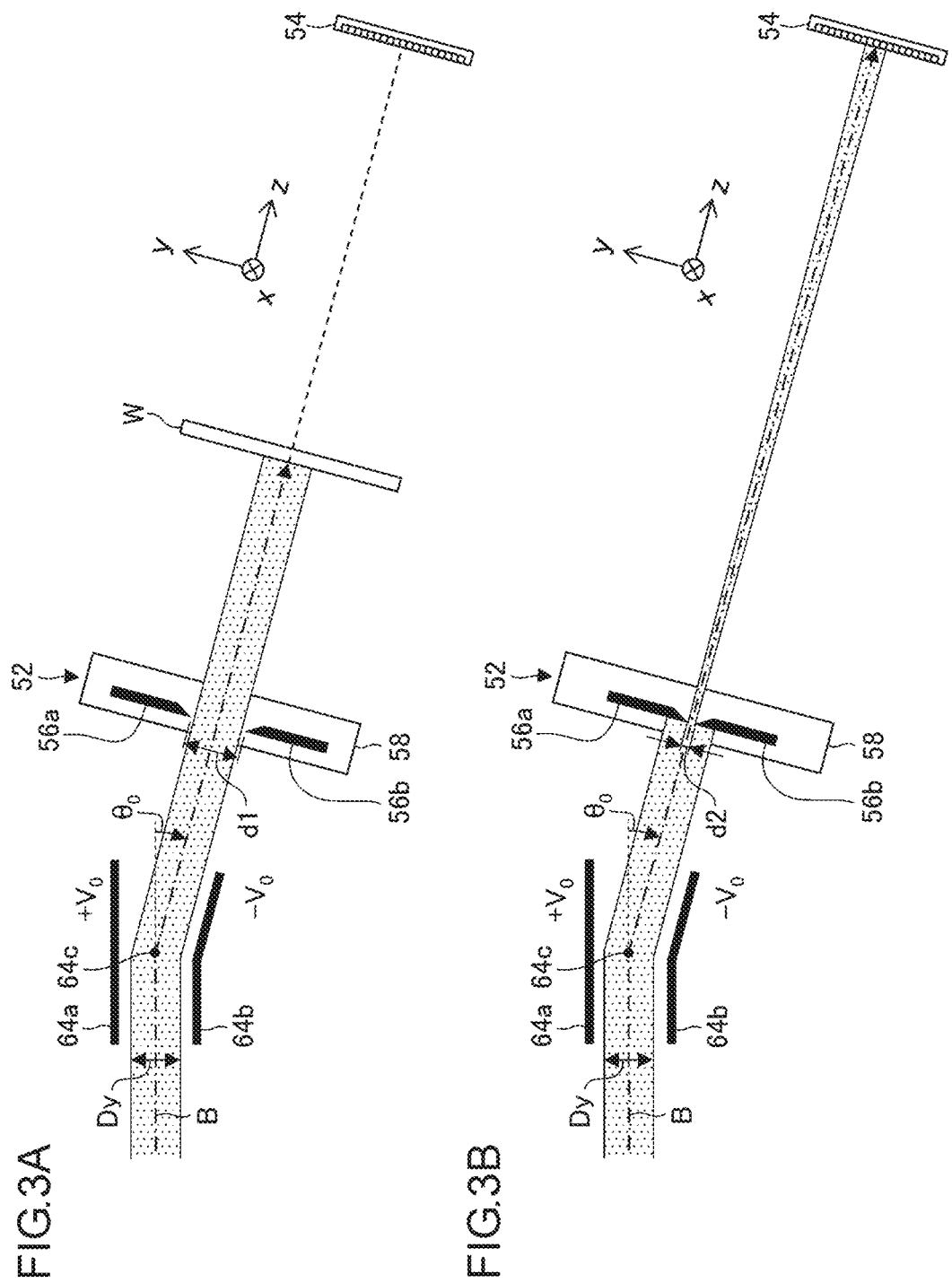

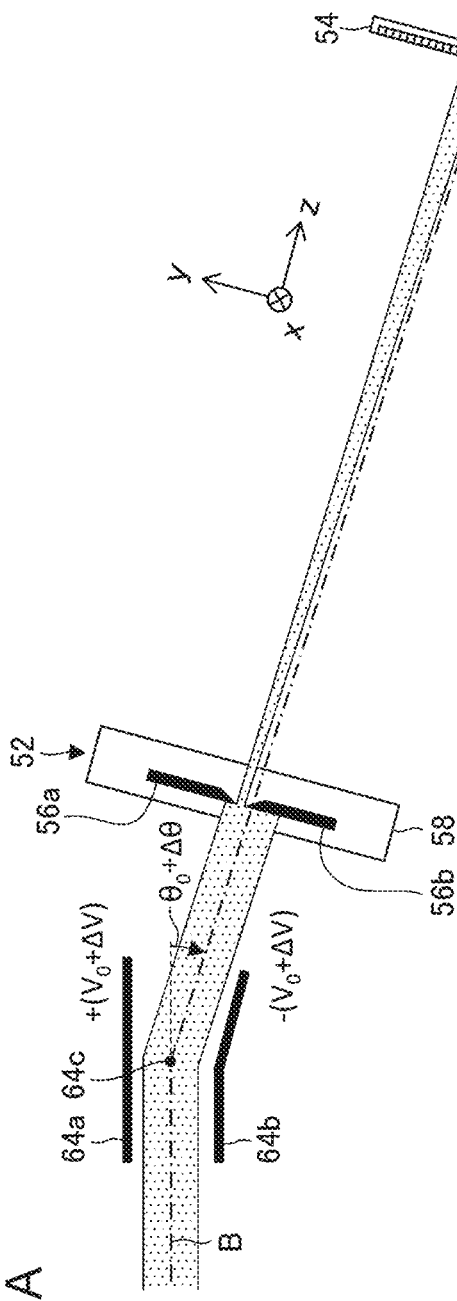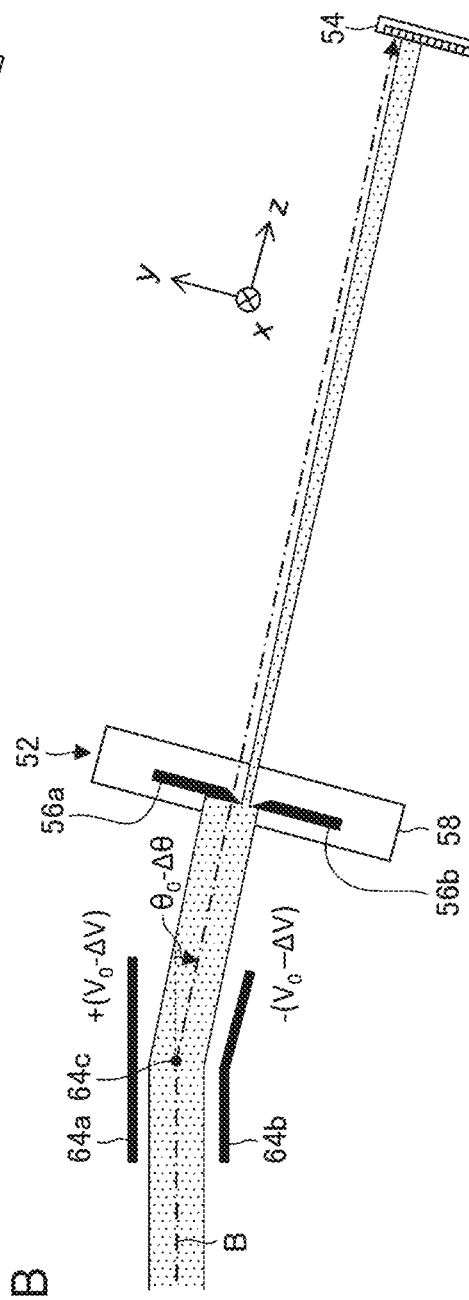

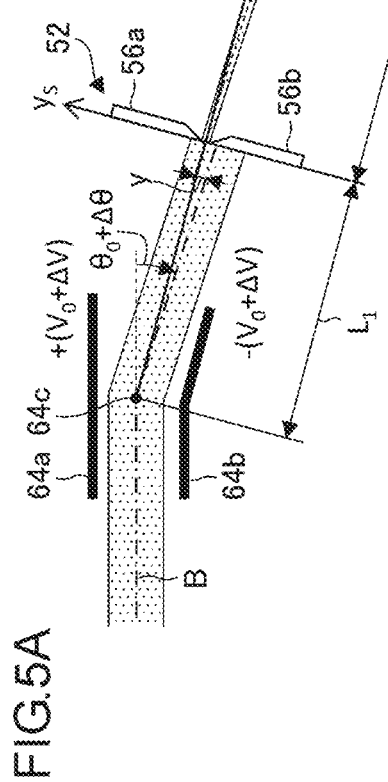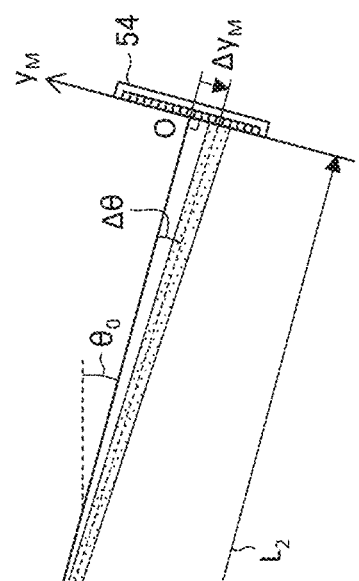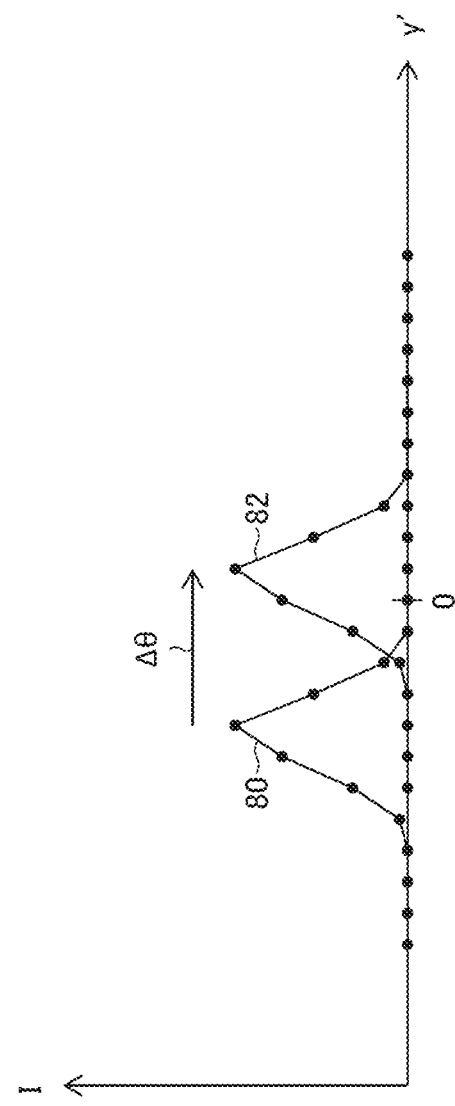
FIG.5A
FIG.5B

ION IMPLANTATION APPARATUS AND ION IMPLANTATION METHOD

RELATED APPLICATIONS

Incorporation by Reference

Priority is claimed to Japanese Patent Application No. 2018-020945, filed Feb. 8, 2018, the entire content of which is incorporated herein by reference.

BACKGROUND

Technical Field

Certain embodiments of the invention relate to an ion implantation apparatus and an ion implantation method.

Description of Related Art

In semiconductor manufacturing processes, a process for implanting ions into a semiconductor wafer (also referred to as an ion implantation process) is conducted as a standard for a change in semiconductor conductivity, a change in the crystal structure of a semiconductor, and the like. It is known that the manner of interaction between an ion beam and a wafer varies with the angle of the ion beam with which the wafer is irradiated and this variation affects ion implantation processing results. The angular distribution of the ion beam is measured before ion implantation. For example, the current value of the beam that has passed through a slit is measured at a plurality of electrodes lining up in the width direction of the slit, and then the angular distribution in the slit width direction can be obtained (see, for example, the related art).

SUMMARY

An ion implantation apparatus according to an embodiment of the invention includes a beamline device configured to transport an ion beam with which a wafer is irradiated, a slit that is provided downstream of the beamline device, a beam current measurement device that is provided at a position away from the slit in a beam traveling direction, and a control device. The beamline device includes a deflection device deflecting the ion beam in a first direction perpendicular to the beam traveling direction by applying at least one of an electric field and a magnetic field to the ion beam. The slit is disposed such that the first direction coincides with a slit width direction. The beam current measurement device is configured to be capable of measuring a beam current at a plurality of measurement positions to be different positions in the first direction. The control device calculates angle information in the first direction on the ion beam by acquiring a plurality of beam current values measured at the plurality of measurement positions to be the different positions in the first direction with the beam current measurement device while changing a deflection amount of the ion beam in the first direction with the deflection device.

Another embodiment of the invention relates to an ion implantation method using an ion implantation apparatus. The ion implantation apparatus includes a beamline device configured to transport an ion beam with which a wafer is irradiated, a slit that is provided downstream of the beamline device, and a beam current measurement device that is provided at a position away from the slit in a beam traveling direction. The beamline device has a deflection device deflecting the ion beam in a first direction perpendicular to the beam traveling direction by applying at least one of an electric field and a magnetic field to the ion beam. The slit is disposed such that the first direction coincides with a slit width direction and configured to have a variable slit width. The beam current measurement device is configured to be capable of measuring a beam current at a plurality of measurement positions to be different positions in the first direction. This method includes calculating angle information in the first direction on the ion beam by acquiring a plurality of beam current values measured at the plurality of measurement positions to be the different positions in the first direction with the beam current measurement device while changing a deflection amount of the ion beam in the first direction with the deflection device, and adjusting an implantation angle of the ion beam with which the wafer is irradiated based on the calculated angle information in the first direction and irradiating the wafer with the ion beam at the adjusted implantation angle.

It is to be noted that any combination of the above constituent elements and mutual substitutions of constituent elements and expressions of the embodiments of the invention among methods, apparatuses, systems, and so on are also effective as aspects of the embodiments of the invention.

BRIEF DESCRIPTION OF THE DRAWINGS

FIGS. 3A and 3B are side views schematically illustrating the operations of a slit during implantation and measurement.

FIGS. 4A and 4B are side views schematically illustrating how an ion beam deflection amount is changed during the measurement.

FIGS. 5A and 5B are diagrams schematically illustrating a correction method of the angular distribution in accordance with the ion beam deflection amount.

DETAILED DESCRIPTION

Figure 1:
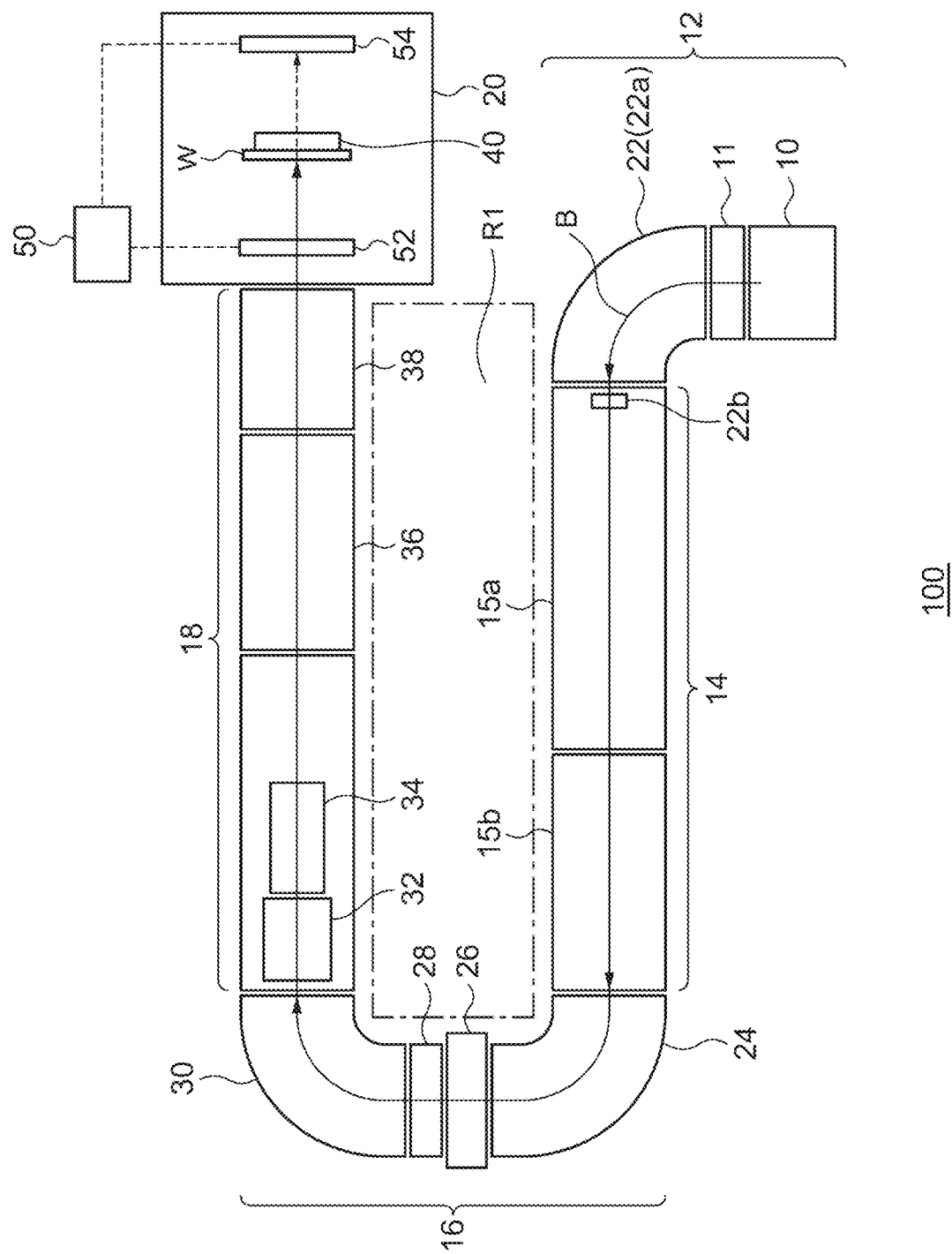
FIG. 1 is a top view schematically illustrating an ion implantation apparatus according to an embodiment.

In order to appropriately grasp ion beam angle information, it is preferable to obtain not only the angular distribution at a specific position within the beam cross section but also the angular distribution over entire of the beam. However, the pan-beam angular distribution measurement takes time as angle measurement needs to be performed at a plurality of positions within the beam cross section while the slit is moved in a beam-crossing direction. For semiconductor manufacturing process throughput improvement, it is preferable that the angular distribution of the beam can be evaluated within a shorter time.

It is desirable to provide a technique for swiftly evaluating the angular distribution of an ion beam.

According to the embodiments of the invention, the angular distribution of an ion beam can be evaluated in a swift manner.

Hereinafter, modes for carrying out embodiments of the invention will be described in detail with reference to accompanying drawings. In the description of the drawings, the same elements are denoted by the same reference numerals, and duplicate description will be omitted as appropriate. In addition, the following configuration is an example, and does not limit the scope of the embodiments of the invention.

FIG. 1 is a top view schematically illustrating an ion implantation apparatus 100 according to an embodiment of the invention. The ion implantation apparatus 100 is a so-called high energy ion implantation apparatus. The high energy ion implantation apparatus is an ion implantation apparatus that has a radio frequency linear acceleration-type ion acceleration unit and a beamline for high energy ion transport, accelerates ions generated at an ion source 10, transports a resultant ion beam B along the beamline to an object to be processed (such as a substrate or a wafer W), and implants the ions into the object to be processed.

The high energy ion implantation apparatus 100 is provided with an ion beam generation unit 12 generating ions and performing mass analysis, a high energy multistage linear acceleration unit 14 accelerating an ion beam into a high energy ion beam, a beam deflection unit 16 performing energy analysis of the high energy ion beam, trajectory correction, and energy dispersion control, a beam transport line unit 18 transporting the analyzed high energy ion beam to the wafer W, a substrate transporting/processing unit 20 implanting the transported high energy ion beam into a semiconductor wafer, and a control device 50.

The ion beam generation unit 12 has the ion source 10, an extracted electrode 11, and a mass analyzer 22. In the ion beam generation unit 12, a beam is extracted from the ion source 10 through the extracted electrode 11 and accelerated simultaneously, and the extracted and accelerated beam is mass-analyzed by the mass analyzer 22. The mass analyzer 22 has a mass analyzing magnet 22a and a mass analyzing slit 22b. Although the mass analyzing slit 22b may be disposed immediately downstream of the mass analyzing magnet 22a, the mass analyzing slit 22b in the example is disposed in the entrance portion of the high energy multistage linear acceleration unit 14, which is the following configuration. As a result of the mass analysis by the mass analyzer 22, only the ion species that is necessary for implantation is selected, and the ion beam of the selected ion species is led to the following high energy multistage linear acceleration unit 14.

The high energy multistage linear acceleration unit 14 is provided with a plurality of linear accelerators, one or more radio frequency resonators and accelerates the ion beam. The high energy multistage linear acceleration unit 14 is capable of accelerating ions by the action of a radio frequency (RF) electric field. The high energy multistage linear acceleration unit 14 is provided with a first linear acceleration unit 15a that is provided with a standard multistage of radio frequency resonator for high energy ion implantation. In addition, the high energy multistage linear acceleration unit 14 may be provided with a second linear acceleration unit 15b that is provided with an additional multistage of radio frequency resonators for ultrahigh energy ion implantation. The direction of the ion beam further accelerated by the high energy multistage linear acceleration unit 14 is changed by the beam deflection unit 16.

The high energy ion beam exiting from the radio frequency-type high energy multistage linear acceleration unit 14 accelerating an ion beam to high energy has a certain range of energy distribution. Accordingly, for beam scanning and beam parallelization to be performed on the high energy ion beam downstream of the high energy multistage linear acceleration unit 14 and for beam irradiation to a wafer, high accuracy energy analysis, trajectory correction, and beam convergence and divergence adjustment need to be performed in advance.

The beam deflection unit 16 performs energy analysis, trajectory correction, and energy dispersion control of the high energy ion beam. The beam deflection unit 16 is provided with at least two high accuracy deflecting electromagnets, at least one energy width limiting slit, at least one energy analysis slit, and at least one horizontal focusing instrument. The deflecting electromagnets are configured to perform energy analysis, precise ion implantation angle correction, and energy dispersion suppression of the high energy ion beam.

The beam deflection unit 16 has an energy analyzing electromagnet 24, a horizontal focusing quadrupole lens 26 which is suppressing energy dispersion, an energy analysis slit 28, and a deflecting electromagnet 30 providing beam steering (trajectory correction). The energy analyzing electromagnet 24 is sometimes called an energy filter electromagnet (EFM). The high energy ion beam heads towards the wafer W after the direction of the high energy ion beam is changed by the beam deflection unit 16.

The beam transport line unit 18 is a beamline device transporting the ion beam B exiting from the beam deflection unit 16, and has a beam shaper 32 configured with focusing/defocusing lens groups, a beam scanner 34, a beam parallelizing unit 36, and a final energy filter 38 (including a final energy separating slit). The length of the beam transport line unit 18 is designed in accordance with the total length of the ion beam generation unit 12 and the high energy multistage linear acceleration unit 14. The implanter 100 forms a layout that has a U shape as a whole by connecting the beam transport line unit 18 and the high energy multistage linear acceleration unit 14 with the beam deflection unit 16.

The substrate transporting/processing unit 20 is provided at the downstream side terminal end of the beam transport line unit 18. The substrate transporting/processing unit 20 is provided with a platen drive device 40 holding the wafer W during of ion implantation and moving the wafer W in a direction perpendicular to the beam scanning direction. In addition, the substrate transporting/processing unit 20 is provided with a slit 52 and a beam current measurement unit 54 measuring a beam that has passed through the slit 52. The configurations of the slit 52 and the beam current measurement unit 54 will be described in detail later.

The beamline portion of the ion implantation apparatus 100 is configured as a horizontal and U-shaped folded beamline that has two long linear portions facing each other. A plurality of units accelerating the ion beam B generated by the ion beam generation unit 12 constitute the upstream long linear portion. A plurality of units adjusting the ion beam B changed in direction with respect to the upstream long linear portion and implanting the ion beam B into the wafer W constitute the downstream long linear portion. The two long linear portions are configured to have substantially the same length. Provided between the two long linear portions is a workspace R1, which has a sufficient area for maintenance work.

Figure 2:
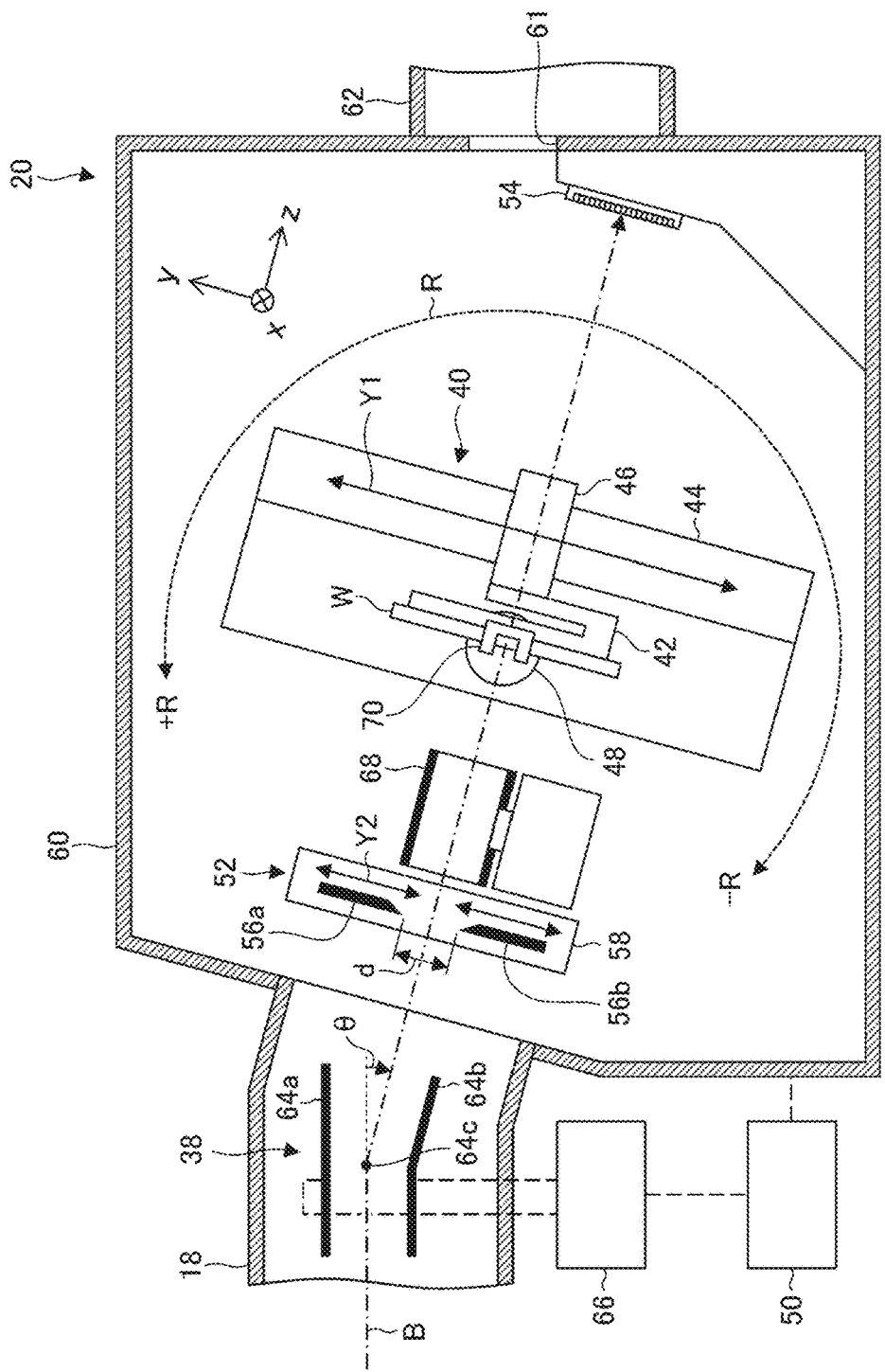
FIG. 2 is a side view illustrating the configuration of a substrate transport processing unit in detail.

FIG. 2 is a side view illustrating the configuration of the substrate transporting/processing unit 20 in detail and illustrating the configuration on the downstream side of the final energy filter 38. The ion beam B is deflected downwards by the final energy filter 38 and is incident into the substrate transporting/processing unit 20. The final energy filter 38 is an electric field-type deflection device and deflects the ion beam B downwards (in the −y direction) with an electric field applied between a pair of angular energy filter (AEF) electrodes 64a and 64b (also collectively referred to as an AEF electrode 64). The beam deflection amount in the final energy filter 38 is adjusted by the value of the voltage applied with an AEF power supply 66 connected to the AEF electrode 64.

The substrate transporting/processing unit 20 includes an implantation process chamber 60 in which an ion implantation process is executed and a substrate transport unit 62 provided with a transport mechanism for transporting the wafer W. The implantation process chamber 60 and the substrate transport unit 62 are connected to each other via a substrate transport port 61.

The implantation process chamber 60 is provided with the platen drive device 40 holding the at least one wafer W. The platen drive device 40 includes a wafer holding device 42, a reciprocating mechanism 44, a twist angle adjustment mechanism 46, and a tilt angle adjustment mechanism 48. The wafer holding device 42 includes, for example, an electrostatic chuck for holding the wafer W. By causing the wafer holding device 42 to reciprocate in a reciprocating direction (the y direction) perpendicular to the beam scanning direction (the x direction), the reciprocating mechanism 44 causes the wafer held by the wafer holding device 42 to reciprocate in the y direction. The arrow Y1 in FIG. 2 exemplifies the reciprocating motion of the wafer W.

The twist angle adjustment mechanism. 46 is a mechanism adjusting the rotational angle of the wafer W. By rotating the wafer W about a normal line on a wafer processing surface, the twist angle adjustment mechanism 46 adjusts the twist angle between a reference position and an alignment mark provided in an outer peripheral portion of the wafer. Here, the alignment mark of the wafer means a notch or an orientation flat provided in the outer peripheral portion of the wafer and a mark serving as a reference of an angular position in a crystal axial direction of the wafer or a circumferential direction of the wafer. The twist angle adjustment mechanism 46 is provided between the wafer holding device 42 and the reciprocating mechanism 44 and is caused to reciprocate with the wafer holding device 42.

The tilt angle adjustment mechanism 48 is a mechanism adjusting the tilt of the wafer W and adjusts the tilt angle between the traveling direction (the z direction) of the ion beam B directed to the wafer processing surface and the normal line on the wafer processing surface. In the present embodiment, an angle having an axis in the x direction as the central axis of rotation among the inclination angles of the wafer W is adjusted as the tilt angle. The tilt angle adjustment mechanism 48 is provided between the reciprocating mechanism 44 and the inner wall of the implantation process chamber 60. The tilt angle adjustment mechanism 48 is configured to adjust the tilt angle of the wafer W by rotating the entire platen drive device 40 including the reciprocating mechanism 44 in an R direction.

In the implantation process chamber 60, the slit 52, a plasma shower device 68, and the beam current measurement unit 54 (also referred to as a first beam current measurement unit 54) are provided from the upstream side toward the downstream side along the trajectory of the ion beam B. The implantation process chamber 60 is provided with a second beam current measurement unit 70 configured to be insertable into an "implantation position" where the wafer W is disposed during ion implantation.

The slit 52 is a horizontal slit in which the slit width direction is the y direction. The slit 52 is a variable slit in which a slit width d in the y direction is variable. The slit 52 is provided with two shielding bodies 56a and 56b (also collectively referred to as a shielding bodies 56) and a drive mechanism 58. The upper shielding body 56a and the lower shielding body 56b are disposed apart from each other in the y direction and are configured to be independently movable in the y direction. Accordingly, the slit 52 is configured as a gap between the upper shielding body 56a and the lower shielding body 56b. The drive mechanism 58 supports the upper shielding body 56a and the lower shielding body 56b and is configured to move the upper shielding body 56a and the lower shielding body 56b independently in the y direction.

The slit width d of the slit 52 that is set during measurement of the angular distribution of the ion beam B differs from the slit width d of the slit 52 that is set during implantation for irradiation of the wafer W with the ion beam B. During the measurement, a relatively narrow slit width is set, and at least a part of the beam passing through the slit 52 is measured by the first beam current measurement unit 54 or the second beam current measurement unit 70 on the downstream side. During the implantation, a relatively wide slit width is set, and the slit 52 functions as an energy defining slit (EDS). The slit 52 during the implantation performs energy analysis, with the AEF electrode 64, on the ion beam B incident into the wafer W and allows the ion beam B having a desired energy value or energy range to pass toward the wafer W while shielding other ion beams.

The plasma shower device 68 is positioned on the downstream side of the slit 52. The plasma shower device 68 supplies low energy electrons to the ion beam and the wafer processing surface in accordance with the beam current of the ion beam B and suppresses the charge-up due to the positive charge on the wafer processing surface that results from ion implantation. The plasma shower device 68 includes, for example, a shower tube through which the ion beam B passes and a plasma generating device supplying electrons into the shower tube.

The first beam current measurement unit 54 is provided on the most downstream side of the beam trajectory and is attached, for example, below the substrate transport port 61. Accordingly, in a case where the wafer W and the second beam current measurement unit 70 are not present on the beam trajectory, the ion beam B is incident into the beam current measurement unit 54. The beam current measurement unit 54 is configured to be capable of measuring, with the slit 52, the angular distribution in the y direction of the ion beam B The beam current measurement unit 54 is provided with a plurality of electrodes disposed side by side in a line in the y direction and is configured to measure the beam current at a plurality of measurement positions to be different positions in they direction. Angular resolution can be enhanced by disposing the beam current measurement unit 54 on the most downstream side away from the slit 52.

The second beam current measurement unit 70 is to measure the beam current on the surface of the wafer W (the wafer processing surface). The second beam current measurement unit 70 is movable, is retracted from the wafer position during implantation, and is inserted into the wafer position when the wafer W is not at the implantation position. For example, the second beam current measurement unit 70 measures the beam current while moving in the x direction to measure the beam current density distribution in the beam scanning direction (the x direction). The second beam current measurement unit 70 may be configured to be capable of measuring the angular distribution in at least one of the x direction and the y direction of the ion beam B.

The control device 50 controls the overall operation of the ion implantation apparatus 100. The control device 50 controls the slit width d of the slit 52 during the implantation and the measurement. The control device 50 controls a deflection angle θ of the ion beam B by the final energy filter 38 during the implantation and the measurement. The deflection angle θ of the ion beam B is defined by regarding a virtual deflection point 64c of the AEF electrode 64 as an origin. The control device 50 acquires a beam current measurement result from the beam current measurement unit 54 and calculates angle information in the y direction of the ion beam B.

FIGS. 3A and 3B are side views schematically illustrating the operations of the slit 52 during the implantation and the measurement. Illustrated in FIG. 3A is a mid-implantation state where the wafer W is irradiated with the ion beam B. Reference voltages +V0 and −V0 are applied to the AEF electrodes 64a and 64b respectively, and the ion beam B is deflected in the direction of a predetermined deflection angle (also referred to as a reference angle) θ0 by the electric field between the AEF electrodes 64a and 64b. The reference angle θ0 is, for example, approximately 10 degrees to 20 degrees. The reference angle θ0 is, for example, 15 degrees.

The upper shielding body 56a and the lower shielding body 56b of the slit 52 are disposed so as to pass at least a part of the beam component of the ion beam B traveling in the direction of the reference angle θ0. A distance (the slit width) d1 between the upper shielding body 56a and the lower shielding body 56b during a mid-implantation state is set to be a relatively large value. For example, the distance d1 is set to be a value exceeding a beam diameter Dy in the y direction of the ion beam B. The mid-implantation slit width d1 is set to be, for example, approximately 110% to 200% of the beam diameter Dy of the ion beam B. For instance, when the beam diameter Dy is approximately 10 mm to 30 mm, the mid-implantation slit width d1 is set to be approximately 11 mm to 60 mm, examples of which include approximately 13 mm to 30 mm.

Illustrated in FIG. 3B is a state during the measurement of the angle information in the y direction of the ion beam B. During the measurement, the wafer W is retracted from the beam trajectory between the slit 52 and the beam current measurement unit 54, and at least a part of the beam passing through the slit 52 is incident into the beam current measurement unit 54. A mid-measurement distance (the slit width) d2 between the upper shielding body 56a and the lower shielding body 56b during the measurement state is set to be a relatively small value and to be a value sufficiently smaller than the beam diameter Dy in the y direction of the ion beam B. The mid-measurement slit width d2 is set to be 20% or less of the beam diameter Dy of the ion beam B. For example, the mid-measurement slit width d2 is set to be 10% or less or 5% or less of the beam diameter Dy. For instance, when the beam diameter Dy is approximately 10 mm to 30 mm, the mid-measurement slit width d2 is set to be approximately 1 mm to 6 mm, examples of which include approximately 2 mm to 5 mm.

FIGS. 4A and 4B are side views schematically illustrating how the deflection amount of the ion beam B is changed during the measurement. Illustrated in FIG. 4A is a case where the deflection amount of the ion beam B is increased to a deflection angle θ0+Δθ, which is increased by Δθ from the reference angle θ0. The magnitude of the deflection angle θ of the ion beam B is substantially proportional to the magnitude of an applied voltage V between the AEF electrodes 64a and 64b. Accordingly, when the absolute values of the voltages respectively applied to the AEF electrodes 64a and 64b are increased by ΔV from a reference voltage V0, the deflection angle can be increased by Δθ, which is proportional to ΔV. Illustrated in FIG. 4B is a case where the deflection amount of the ion beam B is decreased to a deflection angle θ0−Δθ, which is decreased by Δθ from the reference angle θ0. In order to decrease the deflection amount of the ion beam B, it is sufficient to decrease the absolute values of the voltages respectively applied to the AEF electrodes 64a and 64b. For example, the deflection angle can be decreased by Δθ when the absolute values of the voltages respectively applied to the AEF electrodes 64a and 64b are decreased by ΔV from the reference voltage V0.

When the deflection amount of the ion beam B is changed while the opening position of the slit 52 is fixed, the entire of the ion beam B is displaced in the y direction with respect to the opening position of the slit 52. As a result, a beam component at a position shifted in the y direction from the center in the cross section of the entire of the ion beam B passes through the slit 52, which results in a change of the position of the beam component to be measured by the beam current measurement unit 54 in the beam cross section. When the deflection amount is increased, the beam component that is positioned on a relatively upper side becomes a measurement target. When the deflection amount is decreased, the beam component that is positioned on a relatively lower side becomes a measurement target. Accordingly, angle information can be measured over the entire of the beam by changing the deflection amount of the ion beam B continuously or stepwise.

In a case where each beam component is measured while the deflection amount of the ion beam B is changed, the angle information measured by the beam current measurement unit 54 is shifted from the actual angular distribution of the ion beam B by the change amount Δθ of the deflection angle. Accordingly, in the present embodiment, angle information appropriate for the ion beam B is calculated by correction processing for correcting the angular distribution shift depending on the angle change amount Δθ of the deflection angle with respect to the measurement result of the beam current measurement unit 54.

FIGS. 5A and 5B are diagrams schematically illustrating the correction of the angular distribution in accordance with the deflection amount of the ion beam B. Illustrated in FIG. 5A is the relationship between the change amount Δθ of the deflection angle of the ion beam B, the y position of a beam component that is a measurement target, and a shift amount Δy of a measurement position in the y direction on the beam current measurement unit 54. Here, the y position of the beam component that is the measurement target is defined by a y-direction axis yS set on the slit 52, and the shift amount Δy of the measurement position in the y direction on the beam current measurement unit 54 is defined by a y-direction axis yM set on the beam current measurement unit 54. From the illustrated geometrical disposition, a y-direction position y of the beam component passing through the slit 52 can be described as y=L1·tan (Δθ). Here, L1 is a distance in the beam traveling direction (the z direction) from the virtual deflection point 64c between the AEF electrodes 64a and 64b to the slit 52. The shift amount Δy of the measurement position in the y direction on the beam current measurement unit 54 can be described as Δv=L2·tan(Δθ) when beam divergence and convergence are ignored. Here, L2 is a distance in the beam traveling direction (the z direction) from the slit 52 to the beam current measurement unit 54. The change amount Δθ of the deflection angle can be obtained from the voltage V0+ΔV respectively applied to the AEF electrodes 64a and 64b and can be described as Δθ=arctan[{(V0+ΔV)/V0}·tan (θ0)]−θ0.

FIG. 5B is a graph schematically illustrating a pre-correction angular distribution 80 as a measurement result obtained by the beam current measurement unit 54 and a post-correction angular distribution 82. The horizontal axis y' of the graph is a y-direction angle measured by the beam current measurement unit 54 and can be represented by y'=dy/dz. The vertical axis I of the graph is a beam current value measured by the beam current measurement unit 54. As illustrated in the drawing, the post-correction angular distribution 82 is obtained when the y' coordinate of the pre-correction angular distribution 80 as the measurement result obtained by the beam current measurement unit 54 is translated by Δθ such that the above-described change amount Δθ of the deflection angle is offset. In this way, it is possible to obtain angular distribution information of the beam component at the position y.

Figure 6:
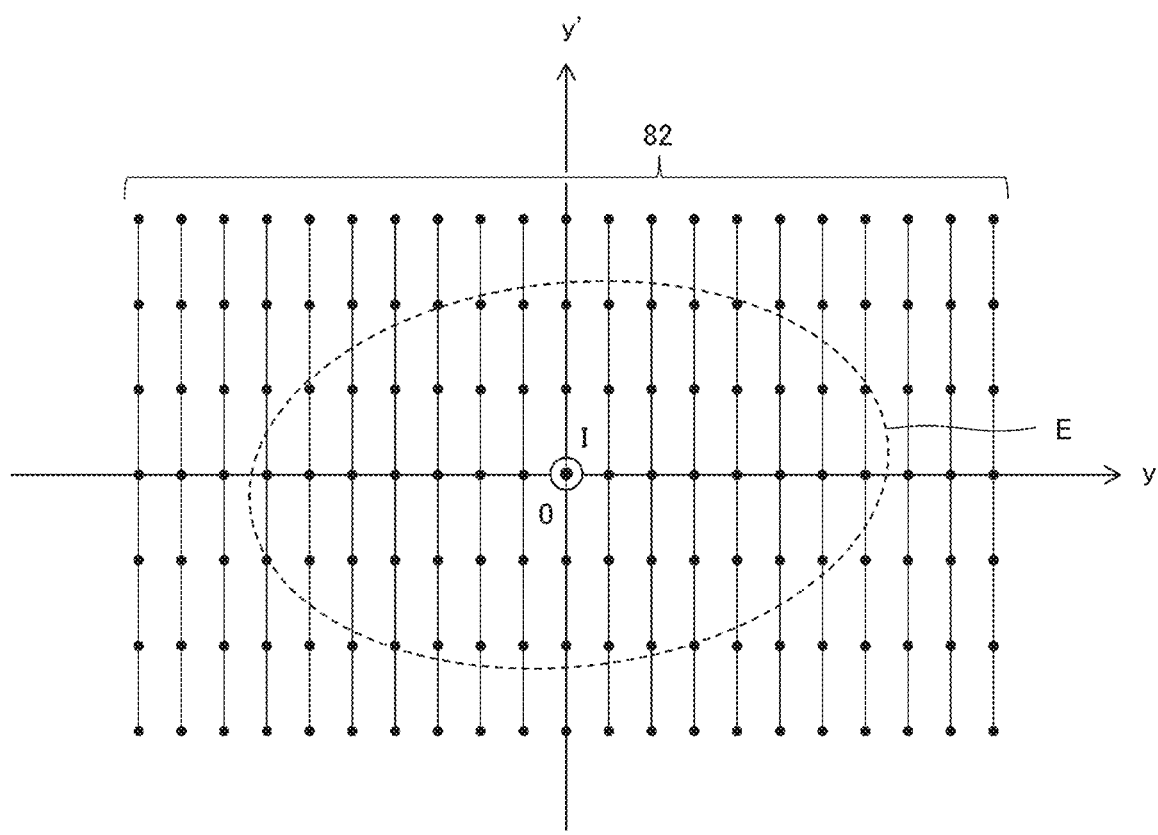
FIG. 6 is a diagram schematically illustrating the phase space profile of the entire of a beam.

FIG. 6 is a diagram schematically illustrating the phase space distribution of the entire of the beam. The horizontal axis y of the graph is the y position of each beam component, and the vertical axis y' is a y-direction angle. The axis perpendicular to the page is a current value I. The graph of FIG. 6 can be created when the post-correction angular distributions 82 obtained with regard to beam components at a plurality of positions y are integrated in one graph. By generating this three-dimensional graph, the control device 50 calculates the angular distribution (the phase space distribution) in the y direction of the entire of the ion beam B.

The control device 50 may calculate the distribution shape of the beam on the phase space (also referred to as a phase space profile E) by surrounding an outer edge of a region where the beam current value I is equal to or greater than a predetermined value. The control device 50 may calculate the angular distribution in the y direction of the entire of the beam represented by the two axes of the y-direction angle y' and the current value I by integrating the data illustrated in FIG. 6 along the horizontal axis y. The control device 50 may calculate the y-direction beam profile of the entire of the beam represented by the two axes of the position y and the current value I by integrating the data illustrated in FIG. 6 along the vertical axis y'.

In order to expedite the calculation of the phase space distribution illustrated in FIG. 6, the control device 50 may acquire a beam current value from only a part of the electrodes provided in the beam current measurement unit 54. For example, in a case where the beam deflection amount is increased as illustrated in FIG. 4A, the beam component passing through the slit 52 is incident into the lower measurement position, and thus the necessity of acquiring the measurement result at the upper measurement position is low. Likewise, in a case where the beam deflection amount is decreased as illustrated in FIG. 4B, the beam component is incident into the slit 52 passes through the upper measurement position, and thus the necessity of acquiring the measurement result at the lower measurement position is low. In addition, in a case where the beam deflection amount is maintained at the reference angle θ0 as illustrated in FIG. 3B, the beam component passing through the slit 52 is incident into the substantially middle measurement position, and thus the necessity of acquiring the measurement results at measurement positions of both y-direction end (an upper end and a lower end) is low. As a result, it is possible to expedite data acquisition by changing the measurement target electrode among the electrodes provided in the beam current measurement unit 54 in accordance with the beam deflection amount and not acquiring the measurement results at electrodes other than the measurement target.

The control device 50 may verify whether or not the measurement is normally performed based on the current value measured at a part of the electrodes of the beam current measurement unit 54. For example, it may be assumed that the measurement is abnormal and an alert may be output in a case where the current value measured at least one of the above-mentioned electrodes other than the measurement target is equal to or greater than a predetermined threshold. In addition, it may be assumed that the measurement is abnormal and an alert may be output in a case where the current value measured at least one of a first end measurement position and a second end measurement position, which are respectively positioned at the both y-direction ends (the upper end and the lower end), is equal to or greater than a predetermined threshold, because that case means the beam reaches a region outer than the measurement region of the beam current measurement unit 54.

The control device 50 is configured to operate in a plurality of measurement modes and may operate in any one of a first mode and a second mode. The first mode is an operation mode for measuring the angular distribution over the entire of the beam, and the second mode is an operation mode for measuring the angular distribution of only a part of the entire of the beam. In the first mode, the phase space profile E as illustrated in FIG. 6 is plotted. In the second mode, a phase space profile E' is plotted based on a smaller number of data than in FIG. 6. In the first mode, for example, the beam is deflected at a deflection amount over a first range that is capable of covering the whole of a y-direction beam width Dy. In the second mode, in contrast, the beam is deflected at a deflection amount over a second range smaller than the first range or the deflection amount of the beam is fixed. In the second mode, the measurement accuracy decreases due to the smaller number of data. Still, the measurement can be expedited, and thus it is possible to obtain approximate angular distribution information within a short time.

Figure 7:
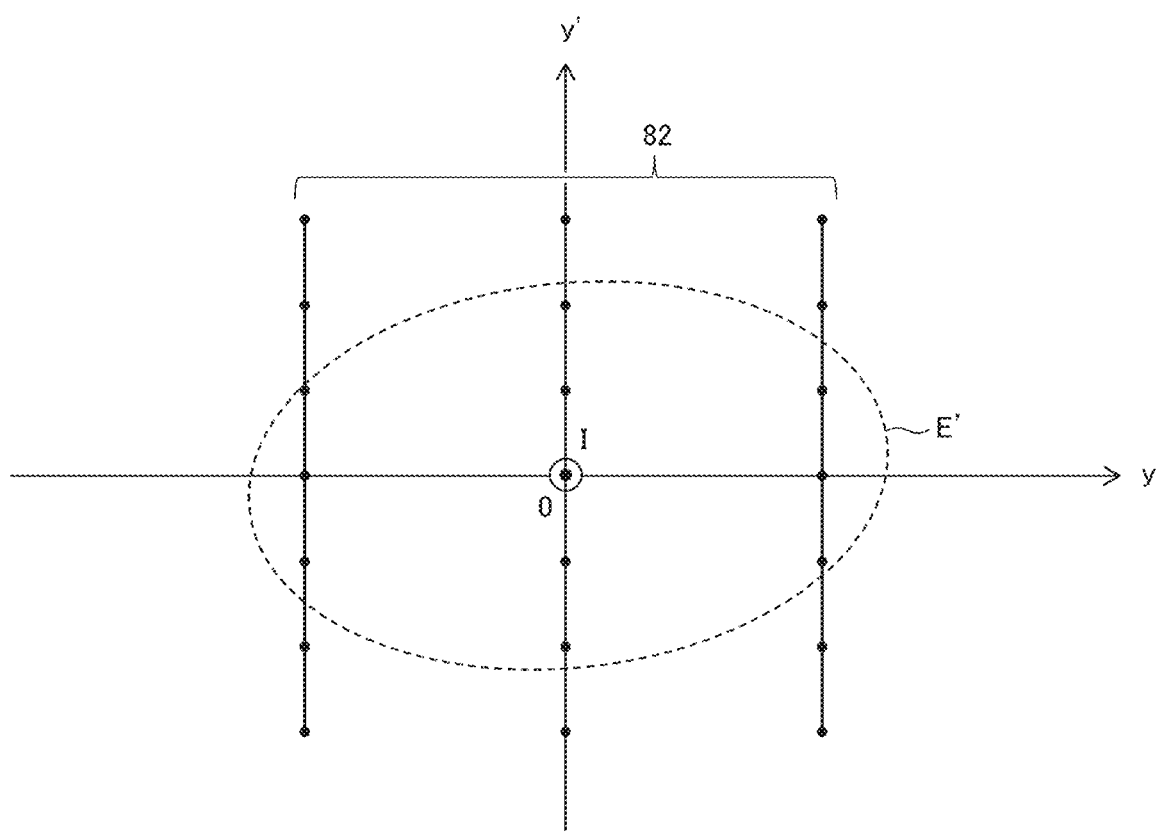
FIG. 7 is a diagram schematically illustrating a partial phase space profile of the beam.

FIG. 7 is a diagram schematically illustrating a partial phase space distribution of the entire of the beam and illustrating an example of measurement in the second mode. The phase space distribution illustrated in FIG. 7 is composed of only the three post-correction angular distributions 82 at different y positions. Accordingly, the measurement can be performed within a shorter time than the measurement of the overall phase space distribution as illustrated in FIG. 6. In addition, by measuring the three angular distributions 82 at different y positions spaced apart each other in the y direction, it is possible to plot the approximate (partial) phase space profile E' from only the three groups of information. For example, it is possible to easily confirm the beam quality when the overall phase space profile E is plotted in the first mode before ion implantation processing initiation, the approximate phase space profile E' is plotted in the second mode during the ion implantation processing, and the phase space profile E' is compared with the pre-plotted highly accurate phase space profile E. The measurement time in the second mode is relatively short, and thus it is possible to complete the measurement during, for example, replacement of the wafer W. In addition, in a case where beam adjustment is performed at a plurality of arbitrary timings, it is possible to easily confirm the beam quality by acquiring the plot of the phase space profile E in the first mode in the initial beam adjustment, acquiring the plot of the approximate phase space profile E' in the second mode in the beam adjustment at the second and subsequent arbitrary timings, and comparing the plot of the approximate phase space profile E' with the plot of the initial phase space profile E. By the use of the second mode, the beam quality can be easily confirmed without significantly degrading the throughput of the implantation processing.

In a case where the approximate phase space profile E' calculated in the second mode does not satisfy a predetermined condition, the control device 50 may measure again the angle information of the ion beam B in the first mode. By acquiring detailed angle information in the first mode, it is possible to evaluate the beam quality more accurately. In addition, by executing the measurement in the first mode only when the condition is not satisfied in the second mode aiming for simple evaluation, it is possible to improve the throughput of the implantation processing. In a case where the result of the measure again in the first mode does not satisfy a predetermined condition, a beamline device operation parameter may be adjusted based on the result of the re-measurement in the first mode, and then the ion beam B that has an angular distribution satisfying the predetermined condition may be generated.

The control device 50 may adjust at least one of the deflection angle of the ion beam B and the tilt angle of the wafer W during the implantation based on the calculated angle information of the ion beam B. For example, in a case where the central coordinates of the phase space profile E of the ion beam B resulting from the measurement shift from preferred coordinates on the phase space distribution (such as the origin (y=0, y'=0)), the control device 50 may adjust at least one of the deflection angle of the ion beam B and the tilt angle of the wafer W during the implantation so as to alleviate the shift.

Figure 8:
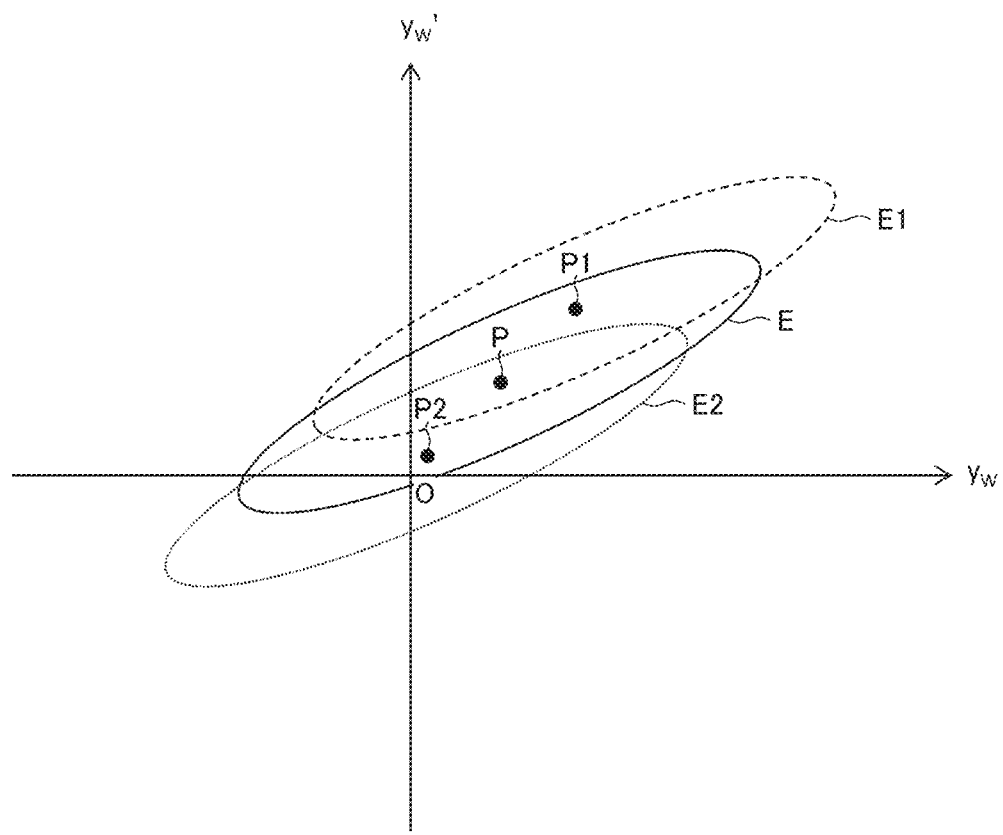
FIG. 8 is a diagram schematically illustrating the relationship between the beam deflection amount and an effective phase space profile.

FIG. 8 is a diagram schematically illustrating the relationship between the beam deflection amount and an effective phase space profile. Here, the "effective phase space profile" refers to a phase space profile based on the angle of ion implantation into an irradiated target surface of the wafer W and is a concept that differs from a usual phase space profile which regards an ideal beam traveling direction (such as the z direction) as a reference. The phase space profile E indicated by the solid line in FIG. 8 is positioned on the upper right side on the yW–yW' plane indicating the phase space distribution with respect to the irradiated target surface of the wafer W, and central coordinates P of the phase space profile E has a shift from an origin O. When the wafer W is irradiated with a beam having the phase space profile E, it may be impossible to obtain a desired depth profile. In some cases, the depth profile of the implanted ions on the irradiated target surface of the wafer W irradiated with the beam depends largely on the incident angle of the ion beam B. In a case where the beam is obliquely incident into the wafer W, it may be difficult for the implanted ions to reach a deep region. The required accuracy for the central angle of the beam and the spread of the angular distribution (such as a full width at half maximum) are, for example, 1 degree or less, and an accuracy of 0.5 degrees or less or 0.1 degrees or less is desired depending on the application of the wafer W that is an irradiation target.

The phase space profiles E1 and E2 indicated by dashed and dotted lines in FIG. 8 are effective phase space profiles viewing from the wafer W in case where of beam deflection amounts are changed. The effective phase space profile E1 indicated by the dashed line corresponds to a case where the beam deflection amount is decreased, and central coordinates P1 of the effective phase space profile E1 is shifted to the upper right side on the yW–yW' plane. In other words, the beam position as viewed from the irradiated target surface of the wafer W is shifted in the +yW direction and the angular distribution of the beam as viewed from the irradiated target surface of the wafer W is shifted in the +yW' direction. The effective phase space profile E2 indicated by the dotted line corresponds to a case where the beam deflection amount is increased, and central coordinates P2 of the effective phase space profile E2 is shifted to the lower left side on the yW–yW' plane. In other words, the beam position as viewed from the irradiated target surface of the wafer W is shifted in the –yW direction and the angular distribution of the beam as viewed from the irradiated target surface of the wafer W is shifted in the –yW' direction. By adjusting the beam deflection amount in this manner, it is possible to perform implant angle adjustment such that the central angle of the effective phase space distribution of the beam as viewed from the wafer W approaches a desired angular value.

Figure 9:
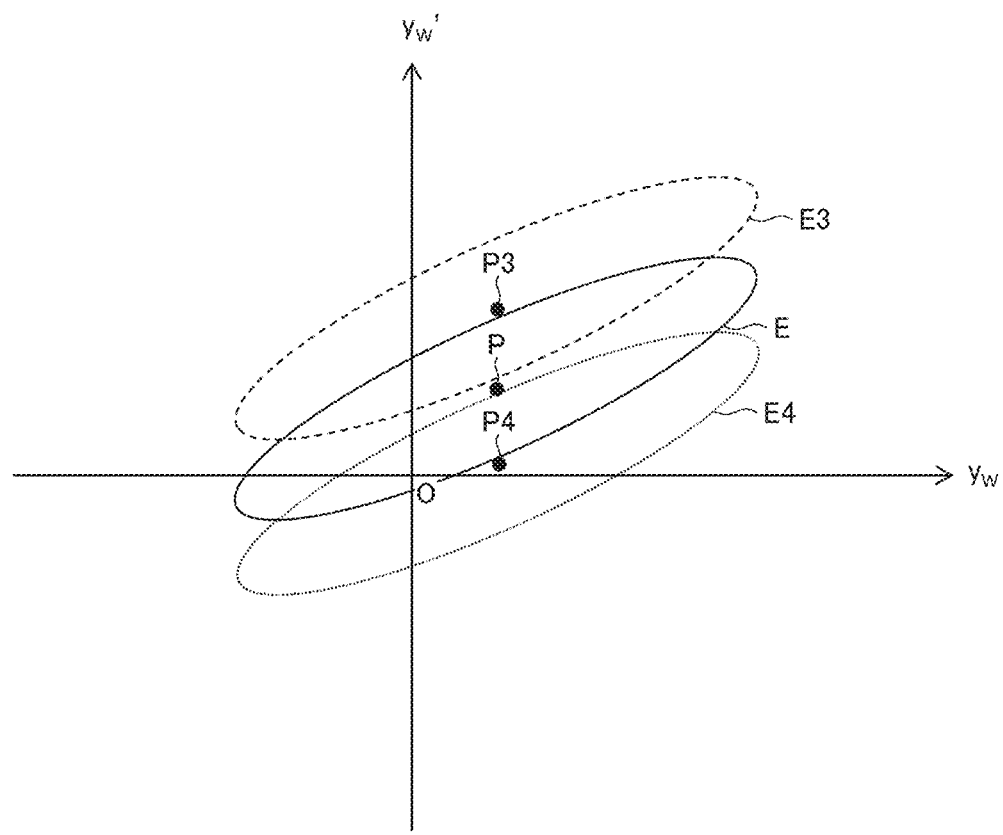
FIG. 9 is a diagram schematically illustrating the relationship between the tilt angle of a wafer and the effective phase space profile.

FIG. 9 is a diagram schematically illustrating the relationship between the tilt angle of the wafer W and the effective phase space profile. In a case where only the tilt angle of the wafer W is changed and the beam deflection amount is not changed, a coordinate position yW in the y direction of the beam as viewed from the irradiated target surface of the wafer W does not change and only an angle yW' at which the beam is incident into the wafer W changes. An effective phase space profile E3 indicated by the dashed line corresponds to a case where the tilt angle of the wafer W illustrated in FIG. 2 is changed in the –R direction, and central coordinates P3 of the effective phase space profile E3 are shifted to the upper side on the yW–yW' plane. An effective phase space profile E4 indicated by the dotted line corresponds to a case where the tilt angle of the wafer W illustrated in FIG. 2 is changed in the +R direction, and central coordinates P4 of the effective phase space profile E4 is shifted to the lower side on the yW–yW' plane. By adjusting the tilt angle of the wafer W in this manner, it is possible perform implant angle adjustment such that the central angle of the effective phase space distribution of the beam as viewed from the wafer W approaches a desired angular value.

Further, it is possible to independently adjust the yW coordinate and the yW' coordinate of the center of the effective phase space profile based on a combination of the beam deflection amount adjustment and the adjustment of the tilt angle of the wafer W.

Figure 10:
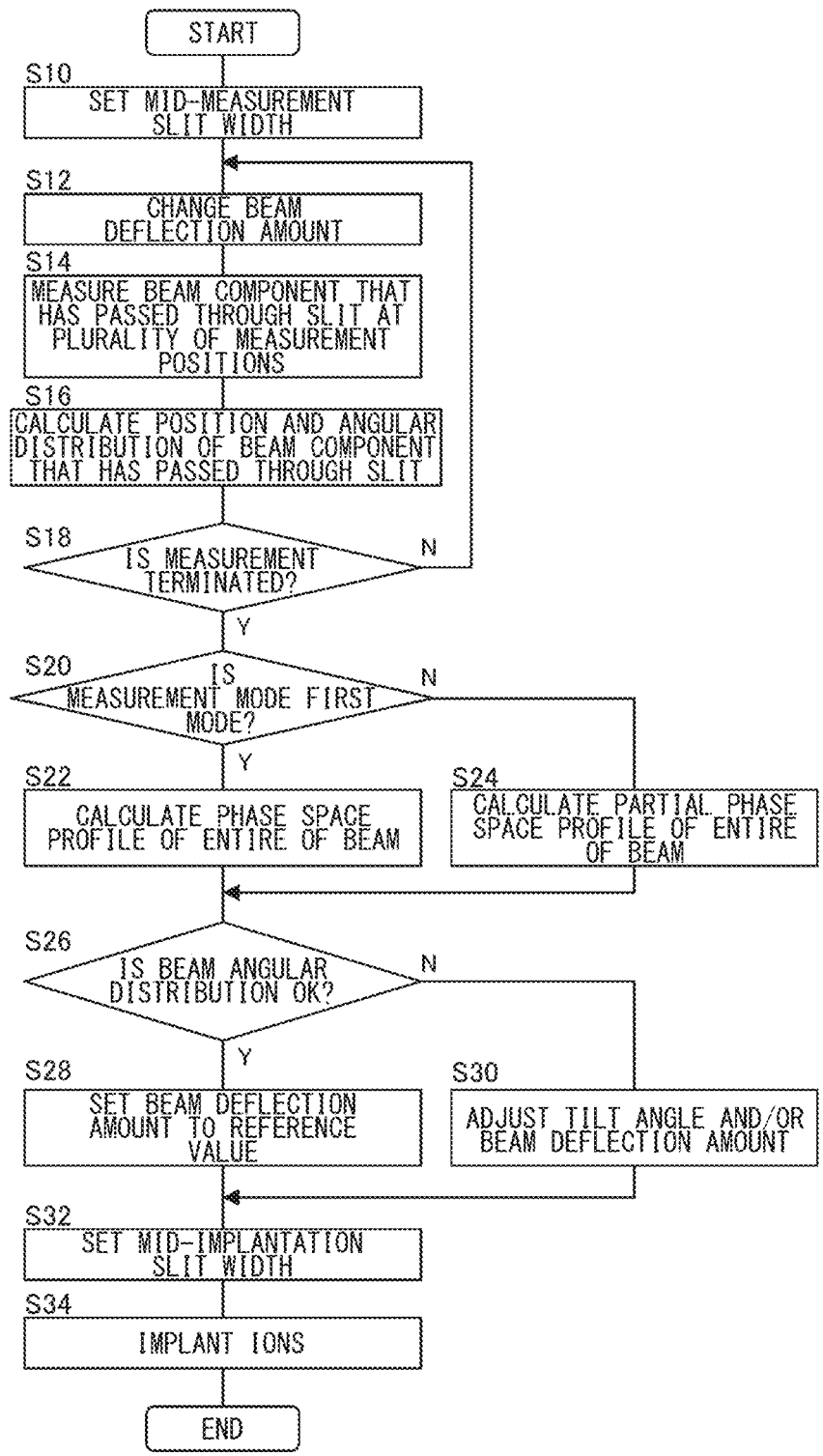
FIG. 10 is a flowchart illustrating the flow of an ion implantation method according to the embodiment.

FIG. 10 is a flowchart illustrating the flow of the ion implantation method according to the embodiment. The slit width of the slit 52 is set to be the mid-measurement slit width d2 (S10), the beam deflection amount of the final energy filter 38 is changed (S12), and the beam component that has passed through the slit 52 is measured at the plurality of measurement positions to be different positions in the y direction (S14). The control device 50 determines the y position of the beam component passing through the slit 52 based on the beam deflection amount of the final energy filter 38 and calculates the angular distribution in which the change amount Δθ of the deflection angle determined based on the beam deflection amount is corrected (S16). When the measurement is yet to complete (N in S18), the beam deflection amount is changed such that the y position of the beam component passing through the slit 52 is changed until a completion condition of the measurement is satisfied (S12), and the processing of S14 and S16 is repeated. When the completion condition of the measurement is satisfied (Y in S18) and the measurement mode is the first mode (Y in S20), the phase space profile E of the entire of the beam is calculated (S22). In a case where the measurement mode is not the first mode but the second mode (N in S20), the partial phase space profile E' of the beam is calculated (S24).

When the calculated phase space profile E or E' is allowable and the angular distribution of the beam is OK (Y in S26), the beam deflection amount is set to be the reference value (the reference angle θ0) (S28), the slit width of the slit 52 is set to be the mid-implantation slit width d1 (S32), and the ion implantation processing is executed (S34). When the calculated phase space profile E or E' is not allowable and the angular distribution of the beam is NG (N in S26), the tilt angle of the wafer W and/or the beam deflection amount is adjusted such that the effective phase space profile is allowable (S30), the slit width of the slit 52 is set to be the mid-implantation slit width d1 (S32), and the ion implantation processing is executed (S34). The angular distribution may be measured again in the first mode, the operation parameter of the beamline device may be adjusted based on the result of the re-measurement, and the angular distribution of the beam itself may be adjusted in a case where the calculated phase space profile E or E' is not allowable.

According to the present embodiment, the angular distribution in the y direction is measured while the ion beam B is moved in the y direction by changing the beam deflection amount of the final energy filter 38, and thus it is possible to expedite the evaluation of the angular distribution over the entire of the ion beam B. For example, in a case where the opening position of the slit 52 is changed in the y direction, the opening position in the y direction is changed by mechanical driving method, and thus it takes time to change the slit position over the entire of the beam. In contrast, in a case where the beam deflection amount is changed, it is sufficient to change the voltage applied to the AEF electrodes 64a and 64b, and thus the ion beam B can be moved in the y direction in a relatively short time and the angular distribution in the y direction of the ion beam B can be evaluated with speed and accuracy.

The invention has been described above based on the embodiments. It is to be understood by those skilled in the art that the invention is not limited to the above embodiments, various design changes are possible, various modification examples are possible, and such modification examples are also within the scope of the embodiments of the invention.

Figure 11:
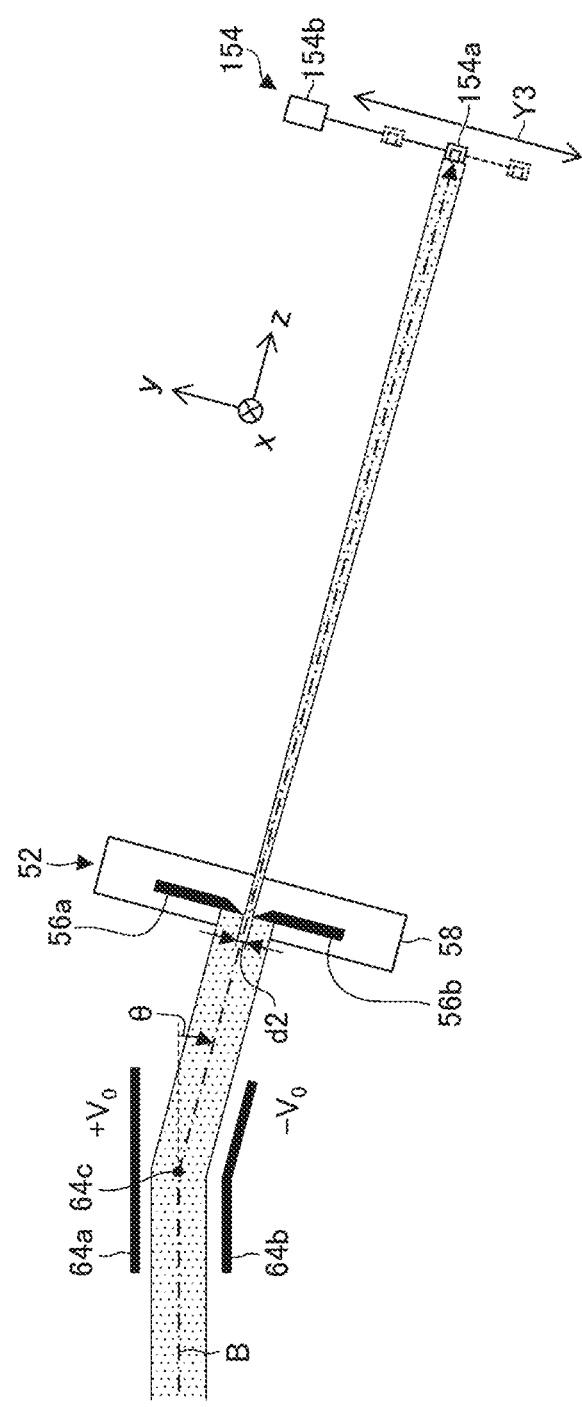
FIG. 11 is a side view schematically illustrating an example of beam angular distribution measurement by a beam current measurement device according to a modification example.

FIG. 11 is a side view schematically illustrating an example of beam angular distribution measurement by a beam current measurement unit 154 according to a modification example. In the present modification example, the beam current is measured by means of a Faraday cup 154a provided with at least one electrode movable in the y direction instead of the beam current measurement unit 54 provided with a plurality of electrodes lining up in the y direction. The beam current measurement unit 154 includes the Faraday cup 154a and a moving mechanism 154b. The moving mechanism 154b moves the Faraday cup 154a in the y direction. As a result, the Faraday cup 154a is disposed at a plurality of measurement positions to be different positions in the y direction. The plurality of measurement positions at which the Faraday cup 154a can be disposed correspond to the positions of the plurality of electrodes according to the embodiment described above.

In the present modification example, the slit width of the slit 52 is set to the mid-measurement slit width d2, the Faraday cup 154a is moved along an arrow Y3, and the beam current is measured at a plurality of measurement positions to be different positions in the y direction. Subsequently, the beam deflection amount of the final energy filter 38 is changed, and then the Faraday cup 154a is moved along the arrow Y3 and the beam current is measured at the plurality of measurement positions to be different positions in the y direction. By repeating these processes, it is possible to calculate the angular distribution of the entire of the ion beam B.

According to the embodiment described above, the deflection amount of the ion beam B is changed by means of the final energy filter 38. In another modification example, the deflection amount of the ion beam B may be changed by means of a deflection device different from the final energy filter 38. The different deflection device may be an electric field-type device, a magnetic field-type device, or a hybrid device using both electric and magnetic fields. In the case of a magnetic field-type device, the y position and the change amount Δθ of the deflection angle of the beam component passing through the slit 52 may be determined from the value of an applied magnetic field.

According to the embodiment described above, the two movable shielding bodies 56a and 56b constitute the slit 52. In another modification example, a plurality of slits having different slit widths in the y direction may be prepared and switching between the mid-implantation slit width d1 and the mid-measurement slit width d2 may be performed based on switching to anyone of the slits. In an alternative configuration, a fixed first slit for use in implantation and a movable second slit for use in measurement may be inserted in series along the beam trajectory, the second slit may be retracted from the beam trajectory during implantation, and the second slit may be disposed on the beam trajectory during measurement.

The configuration according to the embodiment described above is to measure the angular distribution in the y direction of the ion beam B. In another modification example, the angular distribution in the x direction of the ion beam B may be measured or the angular distribution in any direction perpendicular to the beam traveling direction may be measured.

It should be understood that the invention is not limited to the above-described embodiment, but may be modified into various forms on the basis of the spirit of the invention. Additionally, the modifications are included in the scope of the invention.

What is claimed is:
1. An ion implantation apparatus comprising:
a beamline device configured to transport an ion beam with which a wafer is irradiated;
a slit that is provided downstream of the beamline device;
a beam current measurement device that is provided at a position away from the slit in a beam traveling direction; and
a control device,
wherein the beamline device includes a deflection device deflecting the ion beam in a first direction perpendicu- lar to the beam traveling direction by applying at least one of an electric field and a magnetic field to the ion beam, wherein the slit is disposed such that the first direction coincides with a slit width direction, wherein the beam current measurement device is configured to be capable of measuring a beam current at a plurality of measurement positions to be different positions in the first direction, and wherein the control device calculates angle information in the first direction on the ion beam by acquiring a plurality of beam current values measured at the plurality of measurement positions to be the different positions in the first direction by the beam current measurement device while changing a deflection amount of the ion beam in the first direction with the deflection device.

2. The ion implantation apparatus according to claim 1, wherein the control device calculates angular distribution in the first direction of the entire of the ion beam based on the deflection amount of the ion beam in the first direction and the plurality of beam current values measured at the plurality of measurement positions to be the different positions in the first direction.

3. The ion implantation apparatus according to claim 1, wherein the control device calculates phase space distribution in the first direction of the ion beam based on the deflection amount of the ion beam in the first direction and the plurality of beam current values measured at the plurality of measurement positions to be the different positions in the first direction.

4. The ion implantation apparatus according to claim 3, wherein the phase space distribution in the first direction indicates a correlation between positional information in the first direction and the angle information in the first direction on a beam component included in the ion beam, and wherein the control device determines the positional information in the first direction on the beam component passing through the slit based on a value of the applied electric field or the applied magnetic field of the deflection device and determines the angle information in the first direction on the beam component passing through the slit by correcting the measurement position in the first direction measured by the beam current measurement device in accordance with the value of the applied electric field or the applied magnetic field of the deflection device.

5. The ion implantation apparatus according to claim 1, wherein the control device adjusts the deflection amount of the ion beam in the first direction based on the calculated angle information in the first direction on the ion beam when the wafer is irradiated with the ion beam.

6. The ion implantation apparatus according to claim 1, further comprising:

a platen drive device configured to hold the wafer, wherein the platen drive device includes a tilt angle adjustment mechanism adjusting a tilt angle in the first direction between a normal line on a wafer main surface and the beam traveling direction, and wherein the control device adjusts the tilt angle in the first direction based on the calculated angle information in the first direction on the ion beam when the wafer is irradiated with the ion beam.

7. The ion implantation apparatus according to claim 1, wherein the slit is configured to have a variable slit width in the first direction.

8. The ion implantation apparatus according to claim 1, wherein the slit is configured such that a mid-measurement slit width at a time when the beam current is measured by the beam current measurement device and a mid-implantation slit width at a time when the wafer is irradiated with the ion beam differ from each other.

9. The ion implantation apparatus according to claim 8, wherein the mid-measurement slit width is smaller than the mid-implantation slit width.

10. The ion implantation apparatus according to claim 1, wherein the slit is configured as a gap between two shielding bodies and the two shielding bodies are configured to be movable in the first direction independently of each other.

11. The ion implantation apparatus according to claim 1, further comprising:

a plurality of slits that have different slit widths in the first direction, wherein the slit width in the first direction is changed by selecting any one of the plurality of slits.

12. The ion implantation apparatus according to claim 1, wherein a first mode in which the plurality of beam current values measured at the plurality of measurement positions to be the different positions in the first direction are acquired while the deflection amount of the ion beam in the first direction is changed within a first range and a second mode in which the plurality of beam current values measured at the plurality of measurement positions to be the different positions in the first direction are acquired while the deflection amount of the ion beam in the first direction is fixed or changed within a second range smaller than the first range are provided.

13. The ion implantation apparatus according to claim 12, wherein the control device compares angle information on the ion beam measured in the second mode with angle information on the ion beam measured in the first mode as a preliminary and then has the wafer be irradiated with the ion beam in a case where the result of the comparison satisfies a predetermined condition.

14. The ion implantation apparatus according to claim 12, wherein the control device compares angle information on the ion beam measured in the second mode with angle information on the ion beam measured in the first mode in the past as a preliminary and then outputs an alert in a case where the result of the comparison does not satisfy a predetermined condition.

15. The ion implantation apparatus according to claim 12, wherein the control device compares angle information on the ion beam measured in the second mode with angle information on the ion beam measured in the first mode as a preliminary, and then in a case where the result of the comparison does not satisfy a predetermined condition, re-measures the angle information on the ion beam in the first mode and adjusts an operation parameter of the beamline device based on the result of the re-measurement in the first mode.

16. The ion implantation apparatus according to claim 1, wherein the beamline device includes a scanner which conducts reciprocating scanning with the ion beam in a second direction perpendicular to the beam traveling direction and the first direction and a parallelizing device which parallelizes the ion beam going through the reciprocating scanning in the second direction, and wherein the beam current measurement device measures the angle information in the first direction on the ion beam going through the reciprocating scanning in the second direction.

17. The ion implantation apparatus according to claim 1, wherein the beam current measurement device has a plurality of electrodes respectively provided at the plurality of measurement positions to be the different positions in the first direction.

18. The ion implantation apparatus according to claim 1, wherein the beam current measurement device has one or more electrodes and a moving mechanism which moves the one or more electrodes to the plurality of measurement positions to be the different positions in the first direction.

19. The ion implantation apparatus according to claim 1, wherein the beam current measurement device changes the measurement position as to be a measurement target among the plurality of measurement positions to be the different positions in the first direction in accordance with the deflection amount of the ion beam in the first direction.

20. The ion implantation apparatus according to claim 19, wherein the control device outputs an alert in a case where the current value measured at the measurement position as to be a non-measurement target among the plurality of measurement positions to be the different positions in the first direction of the beam current measurement device is equal to or greater than a predetermined threshold.

21. The ion implantation apparatus according to claim 1, wherein the control device outputs an alert in a case where the current value measured at at least one of a first end measurement position and a second end measurement position respectively positioned at both ends in the first direction among the plurality of measurement positions to be the different positions in the first direction of the beam current measurement device is equal to or greater than a predetermined threshold.

22. An ion implantation method using an ion implantation apparatus including a beamline device configured to transport an ion beam with which a wafer is irradiated, a slit that is provided downstream of the beamline device, and a beam current measurement device that is provided at a position away from the slit in a beam traveling direction,
wherein the beamline device has a deflection device deflecting the ion beam in a first direction perpendicular to the beam traveling direction by applying at least one of an electric field and a magnetic field to the ion beam,
wherein the slit is disposed such that the first direction coincides with a slit width direction and configured to have a variable slit width, and
wherein the beam current measurement device is configured to be capable of measuring a beam current at a plurality of measurement positions to be different positions in the first direction,
the ion implantation method comprising:
calculating angle information in the first direction on the ion beam by acquiring a plurality of beam current values measured at the plurality of measurement positions to be the different positions in the first direction with the beam current measurement device while changing a deflection amount of the ion beam in the first direction with the deflection device; and
adjusting an implantation angle of the ion beam with which the wafer is irradiated based on the calculated angle information in the first direction and irradiating the wafer with the ion beam at the adjusted implantation angle.

* * * * *